United States Patent
Miglani et al.

(10) Patent No.: US 11,309,903 B1
(45) Date of Patent: Apr. 19, 2022

(54) SAMPLING NETWORK WITH DYNAMIC VOLTAGE DETECTOR FOR DELAY OUTPUT

(71) Applicant: Texas Instruments Incorporated, Dallas, TX (US)

(72) Inventors: Eeshan Miglani, Chhindwara (IN); Visvesvaraya Appala Pentakota, Bengaluru (IN); Jagannathan Venkataraman, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/131,981

(22) Filed: Dec. 23, 2020

(51) Int. Cl.
*H03M 1/56* (2006.01)
*H03M 1/06* (2006.01)
*H03M 1/50* (2006.01)
*H03M 1/38* (2006.01)

(52) U.S. Cl.
CPC ........... *H03M 1/0656* (2013.01); *H03M 1/38* (2013.01); *H03M 1/50* (2013.01)

(58) Field of Classification Search
CPC ........ H03M 1/0656; H03M 1/38; H03M 1/50; H03M 1/00
USPC ......................................................... 341/166
See application file for complete search history.

(56) References Cited

U.S. PATENT DOCUMENTS

| | | | |
|---|---|---|---|
| 4,612,533 A | 9/1986 | Evans | |
| 4,899,071 A * | 2/1990 | Morales | H03L 7/0816 327/277 |
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |

(Continued)

FOREIGN PATENT DOCUMENTS

| JP | H05206801 | 8/1993 |
|---|---|---|
| KR | 20000028857 | 5/2000 |

(Continued)

OTHER PUBLICATIONS

U.S. Appl. No. 16/517,796, Notice of Allowance, dated Feb. 6, 2020, p. 7.

(Continued)

*Primary Examiner* — Jean B J Jeanglaude
(74) *Attorney, Agent, or Firm* — Mark Allen Valetti; Charles A. Brill; Frank D. Cimino

(57) ABSTRACT

A dynamic voltage-to-delay device may have voltage lines for receiving input signals during reset phases, and a current source, connected to the first and second voltage lines, for increasing voltages on the voltage lines during active phases. The voltage-to-delay device may also have comparators, connected to the voltage lines, for generating first and second output signals during the active phases when the voltages on the voltage lines reach a threshold voltage, such that a delay between the output signals is representative of a difference between voltages of the input signals. The voltage-to-delay device may have at least two current sources. The comparators may have a tail node to which a voltage is applied during a reset phase, and a current source for reducing the voltage at the tail node, and thereby reducing a threshold voltage during an active phase.

18 Claims, 4 Drawing Sheets

(56) References Cited

U.S. PATENT DOCUMENTS

| | | | |
|---|---|---|---|
| 6,002,352 A | 12/1999 | El-Ghoroury et al. | |
| 6,046,612 A | 4/2000 | Taft | |
| 6,069,579 A | 5/2000 | Ito et al. | |
| 6,124,746 A * | 9/2000 | Van Zalinge | H03K 5/13 327/280 |
| 6,144,231 A | 11/2000 | Goldblatt | |
| 6,314,149 B1 * | 11/2001 | Daffron | H03L 7/0807 327/158 |
| 6,377,200 B1 | 4/2002 | Lee | |
| 6,822,596 B2 | 11/2004 | Theiler | |
| 6,836,127 B2 * | 12/2004 | Marshall | H03K 5/08 324/606 |
| 7,046,179 B1 | 5/2006 | Taft et al. | |
| 7,233,172 B2 | 6/2007 | Kanamori et al. | |
| 7,379,007 B2 | 5/2008 | Noguchi | |
| 7,405,689 B2 | 7/2008 | Kernahan et al. | |
| 7,501,862 B2 | 3/2009 | Su et al. | |
| 7,525,471 B2 | 4/2009 | Prodic et al. | |
| 7,557,746 B1 | 7/2009 | Waltari | |
| 7,737,875 B2 | 6/2010 | Waltar et al. | |
| 7,738,265 B2 * | 6/2010 | Trattler | H02M 3/33523 363/20 |
| 7,847,576 B2 | 12/2010 | Kojima | |
| 7,916,064 B2 | 3/2011 | Lin et al. | |
| 7,919,994 B2 * | 4/2011 | Walker | G08C 19/16 327/98 |
| 8,089,388 B2 | 1/2012 | Cui et al. | |
| 8,130,130 B2 | 3/2012 | Danjo et al. | |
| 8,183,903 B2 | 5/2012 | Glass et al. | |
| 8,373,444 B2 | 2/2013 | Lee et al. | |
| 8,421,664 B2 | 4/2013 | Ryu et al. | |
| 8,773,169 B2 | 7/2014 | Dine et al. | |
| 8,836,375 B2 | 9/2014 | Ghatak | |
| 8,896,476 B2 | 11/2014 | Harpe | |
| 9,369,137 B2 | 6/2016 | Masuko | |
| 9,455,695 B2 | 9/2016 | Kull et al. | |
| 9,467,160 B2 | 10/2016 | Chang | |
| 9,685,971 B2 | 6/2017 | Harada | |
| 9,742,424 B2 | 8/2017 | Sharma et al. | |
| 9,917,590 B2 | 3/2018 | Zhang et al. | |
| 10,003,353 B2 | 6/2018 | Kris et al. | |
| 10,284,188 B1 | 5/2019 | Soundararajan et al. | |
| 10,673,452 B1 | 6/2020 | Soundararajan et al. | |
| 10,673,453 B1 | 6/2020 | Pentakota et al. | |
| 10,673,456 B1 | 6/2020 | Dusad et al. | |
| 10,778,243 B2 | 9/2020 | Pentakota et al. | |
| 10,958,258 B2 | 3/2021 | Soundanarajan et al. | |
| 2005/0104626 A1 | 5/2005 | Wakamatsu et al. | |
| 2006/0158365 A1 | 7/2006 | Kemahan et al. | |
| 2008/0297381 A1 | 12/2008 | Kemahan et al. | |
| 2010/0085101 A1 * | 4/2010 | Walker | G08C 19/16 327/306 |
| 2012/0105264 A1 | 5/2012 | Ryu et al. | |
| 2012/0176158 A1 | 7/2012 | Lee et al. | |
| 2012/0212358 A1 | 8/2012 | Shi et al. | |
| 2013/0009796 A1 | 1/2013 | Sakiyama et al. | |
| 2013/0021118 A1 | 1/2013 | Kabir et al. | |
| 2013/0169463 A1 | 7/2013 | Stein et al. | |
| 2014/0361917 A1 | 12/2014 | Matsuno et al. | |
| 2015/0008894 A1 * | 1/2015 | Cannankurichi | H02M 3/07 323/282 |
| 2015/0244386 A1 | 8/2015 | El-Chammas | |
| 2015/0260552 A1 | 9/2015 | Yao et al. | |
| 2019/0007071 A1 | 1/2019 | Nagarajan et al. | |
| 2019/0280703 A1 | 9/2019 | Naru et al. | |
| 2020/0195268 A1 | 6/2020 | Soundararajan et al. | |

FOREIGN PATENT DOCUMENTS

| | | |
|---|---|---|
| KR | 2001044806 | 2/2001 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

U.S. Appl. No. 17/158,526, Notice of Allowance, dated Jan. 14, 2022, p. 8.

* cited by examiner

SAMPLING NETWORK WITH DYNAMIC VOLTAGE DETECTOR FOR DELAY OUTPUT

BACKGROUND

An analog-to-digital (A/D) converter (ADC) may be used to generate digital codes which represent an analog signal. A radio-frequency (RF) sampling receiver may be used to receive and digitize a high frequency analog signal. An analog-to-digital converter for digitizing a signal in a radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.), and 2019/0280703 (Naru et al.).

Some analog-to-digital converters have one or more voltage-to-delay (V2D) components and operate, at least in part, in a delay domain. Delay-based analog-to-digital converters are described in U.S. patent application Ser. No. 16/217,643 (Soundararajan et al., filed Dec. 12, 2018) (U.S. Pub 2020/0195268 (Jun. 18, 2020)), Ser. No. 16/410,698 (Dusad et al., filed May 13, 2019) (U.S. Pat. No. 10,673,456 (Jun. 2, 2020)), and Ser. No. 16/517,796 (Pentakota et al., filed Jul. 22, 2019) (U.S. Pat. No. 10,673,453 (Jun. 20, 2020)). The entire disclosures of U.S. patent application Ser. Nos. 16/217,643, 16/410,698, and 16/517,796 are incorporated herein by reference. In addition, the entire disclosures of the five U.S. patent applications identified below in Table 1 are incorporated herein by reference. Delay-based analog-to-digital converters may be operated, if desired, at high speed, with reduced area and power requirements.

TABLE 1

| Title | Inventors | Serial No. |
| --- | --- | --- |
| PIECEWISE CALIBRATION FOR HIGHLY NON-LINEAR MULTI-STAGE ANALOG-TO-DIGITAL CONVERTER | Narasimhan Rajagopal, Visvesvaraya Pentakota and Eeshan Miglani | 17/126,157 |
| DIFFERENTIAL VOLTAGE-TO-DELAY CONVERTER WITH IMPROVED CMMR | Prasanth K, Eeshan Miglani, Visvesvaraya Appala Pentakota, Kartik Goel, VenkataramanJagannathan and Sai Aditya Nurani | |
| DELAY FOLDING SYSTEM AND METHOD | Eeshan Miglani, Visvesvaraya Pentakota and Chirag Chandrahas Shetty | 17/129,130 |
| LOOKUP-TABLE-BASED ANALOG-TO-DIGITAL CONVERTER | Visvesvaraya Pentakota, Narasimhan Rajagopal, Chirag Shetty, Prasanth K, Neeraj Shrivastava, Eeshan Miglani and Jagannathan Venkataraman | |
| GAIN MISMATCH CORRECTION FOR VOLTAGE-TO-DELAY PREAMPLIFIER ARRAY | Narasimhan Rajagopal, Chirag Shetty, Neeraj Shrivastava, Prasanth K and Eeshan Miglani | |

SUMMARY

The present disclosure relates to a dynamic voltage-to-delay device which includes: first and second voltage lines for receiving input signals during reset phases; a current source, connected to the first and second voltage lines, for increasing voltages on the voltage lines during active phases; and first and second comparators, connected to the first and second voltage lines, for generating first and second output signals during the active phases when the voltages on the voltage lines reach a threshold voltage, such that a delay between the first and second output signals is representative of a difference between voltages of the input signals.

The present disclosure also relates to a dynamic voltage-to-delay device which has at least one voltage line for receiving an input signal during a reset phase, at least one current source, connected to the voltage line, for increasing voltage on the voltage line during an active phase, and at least one comparator, connected to the voltage line, for generating an output signal during the active phase when the voltage on the voltage line reaches a threshold voltage, such that timing of the output signal is representative of voltage of the input signal.

The present disclosure also relates to a dynamic voltage-to-delay device which includes: first and second voltage lines for receiving input signals during reset phases; first and second comparators, connected to the first and second voltage lines, and having a tail node, wherein the first and second comparators are configured to generate first and second output signals during active phases when voltages on the voltage lines reach a threshold voltage; and a transistor, connected to the tail node of the first and second comparators, and a current source, connected to the transistor, for continuously reducing the threshold voltage during the active phases, such that output signals corresponding to the first and second voltage lines toggle when the threshold voltage becomes equal to respective voltages on the first and second voltage lines, to thereby produce delay between the first and second output signals representative of a difference between voltages of the input signals.

BRIEF DESCRIPTION OF THE DRAWINGS

Like elements are designated by like reference numerals and other characters throughout.

DETAILED DESCRIPTION

Several example embodiments (such as those illustrated in FIGS. 1, 3, 4 and 6) include a preamplifier/comparator for converting an input signal operating in the voltage domain to a signal operating in the delay domain. These example embodiments may be utilized in analog-to-digital converters (ADCs) that operate in the delay domain. For example, U.S. Pat. Nos. 10,284,188 and 10,673,643 disclose ADCs that operate in the delay domain and utilize comparators.

Figure 1:
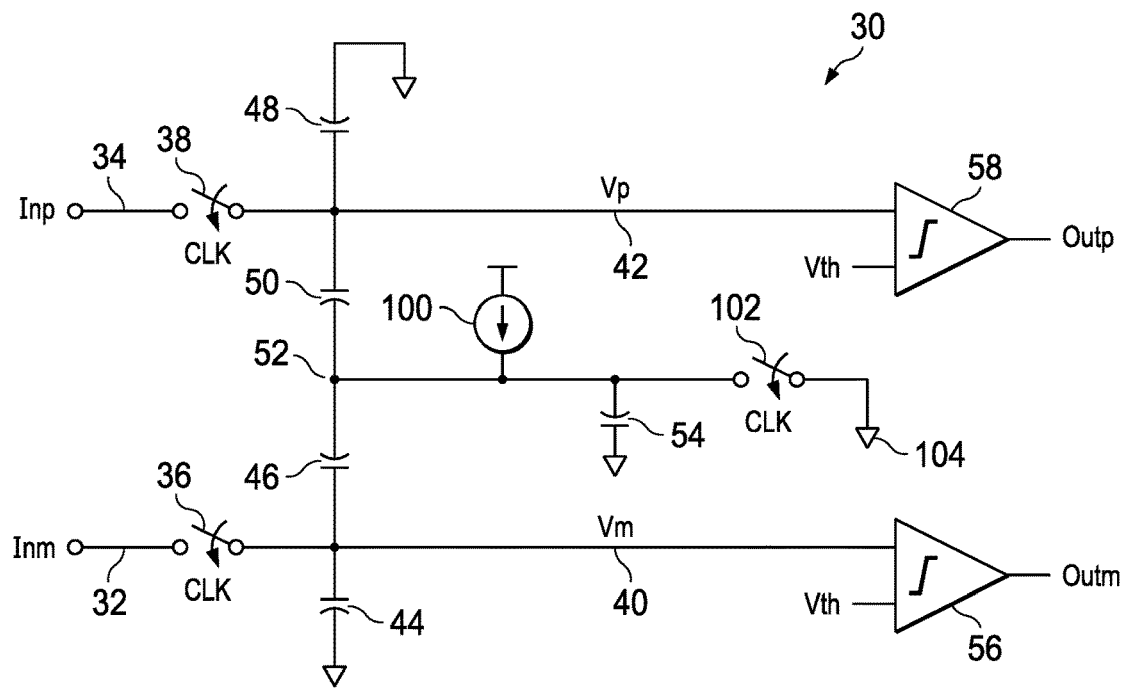
FIG. 1 is a circuit diagram of a dynamic circuit for sampling input signals and generating output signals with delay corresponding to the input signals.

FIG. 1 illustrates a dynamic circuit 30 for sampling first and second input signals Inm and Inp and for generating corresponding output signals Outm and Outp. The difference in timing (that is, the delay) between the leading edges of the first and second output signals Outm and Outp is representative of the difference in voltage between the first and second input signals Inm and Inp. In some example embodiments, Inm and Inp are complementary signals and Outm and Outp are complementary signals. As an example, the complementary signals for an input voltage, Vin, may be expressed as Vin=V1−V2 where V1 and V2 are complementary signals. In other words, V1=a+Vin/2 and V2=a−Vin/2, where a is a numerical value (such as 0.7 volts). Further description of Inm (also referred to as Vinm), Inp (also referred to as Vinp), Outn (also referred to as Outnx where x is an integer) and Outp (also referred to as Outpx where x is an integer) is provided in U.S. Pat. Nos. 10,284,188 and 10,673,643, which are herein incorporated by reference in their entirety.

The first and second input signals Inm and Inp illustrated in FIG. 1 are supplied on respective first and second input lines 32 and 34. The first and second input signals Inm and Inp may be, if desired, differential components of an analog signal of unknown voltage. The delay represented by the corresponding first and second output signals Outm and Outp may be used by a delay-based analog-to-digital converter to generate a digital code representative of the voltage of the analog signal. According to another aspect of the present disclosure, the first and second input signals Inm and Inp may be differential components of a signal of known voltage, such as one generated by a digital-to-analog converter, and the delay represented by the corresponding output signals Outm and Outp may be used to calibrate a delay-based analog-to-digital converter, or to calibrate one or more devices of a delay-based analog-to-digital converter.

In the example illustrated in FIG. 1, the first and second input lines 32 and 34 are selectively connected, by respective first and second switches 36 and 38, to respective first and second voltage lines 40 and 42. The switches 36 and 38 are both opened and closed under the control of a suitable clock signal CLK. The first voltage line 40 is connected to a first parasitic capacitance component 44 and a first sample capacitor 46. The second voltage line 42 is connected to a second parasitic capacitance component 48 and a second sample capacitor 50. The first and second sample capacitors 46 and 50 are connected to each other through a middle node 52. The middle node 52 is connected to a middle-node parasitic capacitance component 54.

The first and second voltage lines 40 and 42 are connected to, and supply respective first and second voltages Vm and Vp to, the second inputs of respective first and second continuous time comparators 56 and 58. A common threshold voltage Vth is supplied to the first inputs of the comparators 56 and 58. The value of the threshold voltage Vth is set just above the maximum value of voltages of the first and second input signals Inm and Inp. In the example illustrated in FIG. 1, the threshold voltage Vth is greater than the voltage of the first input signal Inm and greater than the voltage of the second input signal Inp. The first comparator 56 generates the first output signal Outm based on the difference between the first voltage Vm and the threshold voltage Vth. The second comparator 58 generates the second output signal Outp based on the difference between the second voltage Vp and the threshold voltage Vth.

A ramp current source 100 is connected to the middle node 52, and is selectively connected, by a suitable switch 102, to signal ground 104. The switch 102 is operated under the control of the clock signal CLK. The timing of the clock signal CLK is illustrated, by way of example, in FIG. 2.

When the clock signal CLK is high (1), the three switches 36, 38 and 102 are all closed, such that current from the current source 100 is discharged to signal ground 104; the voltage Vmidn (FIG. 2) at the middle node 52 is essentially zero; and the first and second voltages Vm and Vp are approximately equal to the voltages Vinm and Vinp of the first and second input signals Inm and Inp. In the example illustrated in FIG. 2, the clock signal CLK is high during a first reset phase, from time (t)=0.0 to t=0.4. In the illustrated example, during that time frame (that is, during the first reset phase), the middle node voltage Vmidn is essentially zero, and changes in the first and second voltages Vm and Vp (on the voltage lines 40 and 42) approximate changes in the voltages Vinm and Vinp of the first and second input signals Inm and Inp (on the input lines 32 and 34).

When the clock signal CLK is low, the three switches 36, 38 and 102 are open, such that current from the current source 100 is not discharged to ground 104, but causes the voltage Vmidn at the middle node 52 to ramp upwardly, which causes the first and second voltages Vm and Vp to ramp upwardly under the influence of the middle node voltage Vmidn. During a first active phase (when the clock signal CLK is low), following the first reset phase, the values of the first and second voltages Vm and Vp change dynamically (that is, ramp upwardly). As the first and second voltages Vm and Vp ramp upwardly, the difference d1 between the first and second voltages Vm and Vp remains approximately the same, and approximately the same as the difference d0 between the first and second voltages Vm and Vp at the time the clock signal CLK toggles low (that is, at the beginning of the first active phase).

When the clock signal CLK becomes high again, at the end of the first active phase, the three switches 36, 38 and 102 are closed, such that the voltage Vmidn at the middle node 52 is essentially zero, and the first and second voltages Vm and Vp are approximately equal to the voltages Vinm and Vinp of the first and second input signals Inm and Inp. In the example illustrated in FIG. 2, the clock signal CLK is high from the end of the first active phase until the end of a second reset phase, that is, from t=0.9 tot=1.4. The present disclosure is not limited, however, to the examples described herein.

When the clock signal CLK toggles low again, at the end of the second reset phase, the three switches 36, 38 and 102 are opened, such that current from the current source 100 again causes the first and second voltages Vm and Vp to ramp upwardly. As the first and second voltages Vm and Vp ramp upwardly, during the second active phase, the difference d2 between the first and second voltages Vm and Vp remains approximately the same, and approximately the same as the difference between the first and second voltages Vm and Vp at the time the clock signal CLK toggles low (that is, at the end of the second reset phase).

In the illustrated example, the difference d2 between the first and second voltages Vm and Vp at the end of the second reset phase and throughout the second active phase happens to be greater than the difference d1 between the first and second voltages Vm and Vp throughout the first active phase. The difference between the difference values d1 and d2 reflects a corresponding difference between the voltages Vinm and Vinp of the first and second input signals Inm and Inp at the beginnings of the first and second active phases (at t=0.4 and t=1.4 in the illustrated example).

Figure 2:
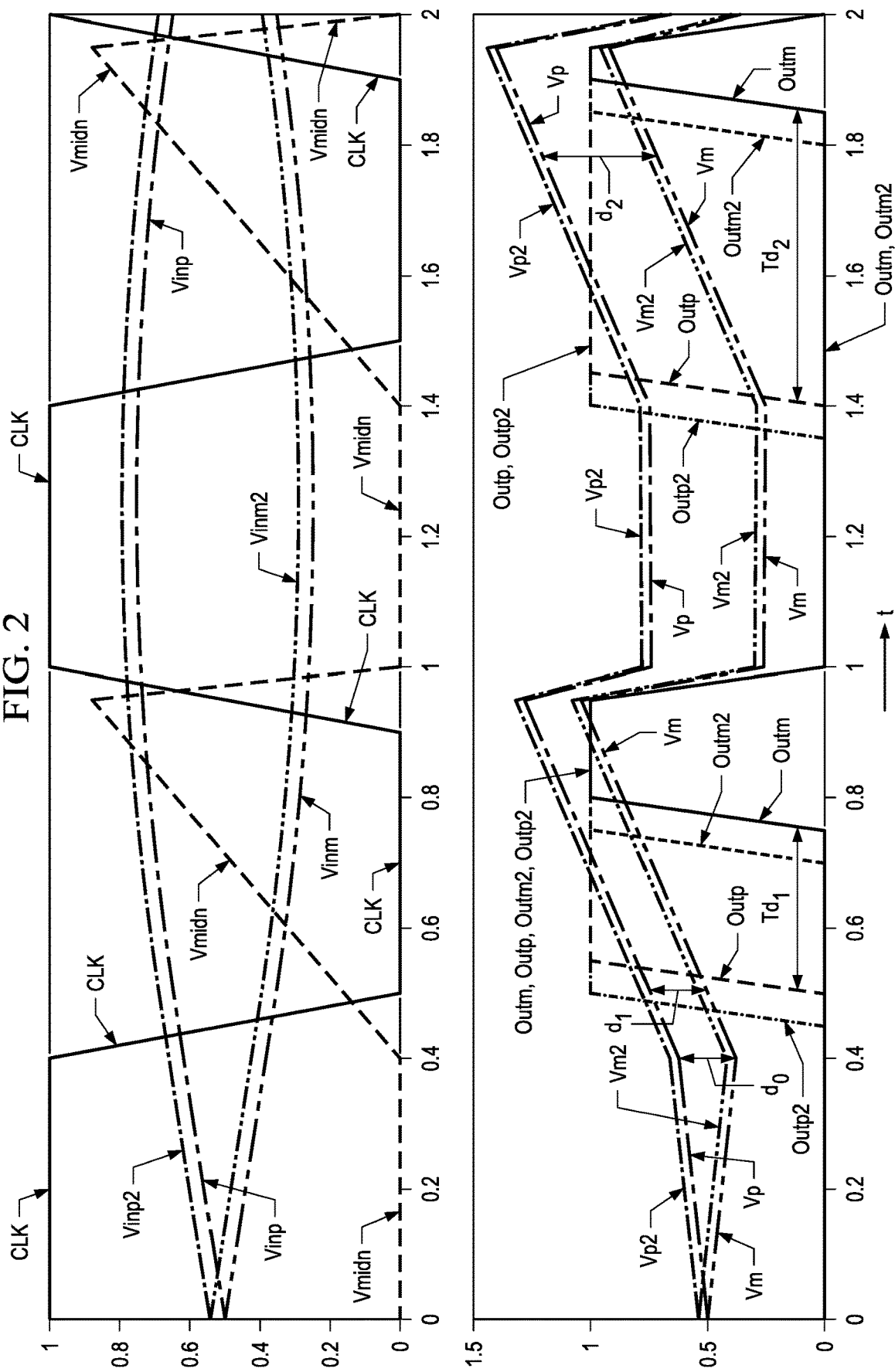
FIG. 2 is a diagram of timings and voltages of digital and analog signals processed by the dynamic circuit of FIG. 1.

The first and second output signals Outm and Outp are digital signals (FIG. 2). During the first active phase, the first output signal Outm toggles high (1) when the upwardly ramping first voltage Vm (applied to the second input of the first comparator 56) reaches the threshold voltage Vth. During the same first active phase, the second output signal Outp toggles high (1) when the upwardly ramping second voltage Vp reaches the threshold voltage Vth. In the illustrated example, the second voltage Vp is greater than the first voltage Vm (by an amount equal to d1) throughout the first active phase, and the leading edge of the second output signal Outp precedes the leading edge of the first output signal Outm by a corresponding amount of delay Td1. Then, continuing with the illustrated example, at the end of the first active phase, the first and second voltages Vm and Vp return to the voltages Vinm and Vinp of the first and second input signals Inm and Inp, and the comparators 56 and 58 are reset (FIG. 3) such that the first and second output signals Outm, Outp both toggle low (0).

Continuing with the example illustrated in FIG. 2, during the second active phase (starting at t=1.4), the first output signal Outm toggles high (1) when the upwardly ramping first voltage Vm reaches the threshold voltage Vth, and the second output signal Outp toggles high (1) when the second voltage Vp reaches the threshold voltage Vth. In the illustrated example, during the second active phase, the second voltage Vp is greater than the first voltage Vm by an amount equal to d2, and the leading edge of the second output signal Outp precedes the leading edge of the first output signal Outm by a corresponding amount of delay Td2. The difference d2 between the upwardly ramping voltages Vm and Vp in the second active phase is greater than the difference d1 in the first active phase. Consequently, the delay Td2 represented by the output signals Outm and Outp in the second active phase is greater than the delay Td1 represented in the first active phase. Then, at the end of the second active phase, the first and second voltages Vm and Vp fall with the falling Vmidn until they are equal to Vinm and Vinp, and the first and second output signals Outm, Outp toggle low (0).

The timing and voltages for the analog input voltages Vinm and Vinp, the dynamically influenced voltages Vm and Vp, and the digital output signals Outm and Outp illustrated by solid lines in FIG. 2 are for an example where the common-mode voltage of the analog input signal Inm and Inp is 0.5 volts. The x-axis of FIG. 2 measures units of time (t). FIG. 2 also shows timings and voltages for analog input voltages Vinm2 and Vinp2, dynamically influenced voltages Vm2 and Vp2, and digital output signals Outm2 and Outp2 for an example where the common-mode voltage of the analog signal is 0.54 volts. Thus, FIG. 2 illustrates two examples. The first example involves a set of changing values Vinm, Vinp, Vm, Vp, Outm and Outp. The second example, for comparison purposes, involves a corresponding second set of changing values Vinm2, Vinp2, Vm2, Vp2, Outm2 and Outp2. The second set of changing values Vinm2, Vinp2, Vm2, Vp2, Outm2 and Outp2 is shown in broken lines in FIG. 2.

The two sets of changing values are different from each other, as shown in FIG. 2, because the common-mode voltage in the first example is 0.5 volts whereas the common-mode voltage in the second example is 0.54 volts. In the first example, the average of the voltages Vinm and Vinp of the input signals Inm and Inp is 0.5 volts. However, the common mode of the input signals Inm and Inp can change. Thus, in the second example, for comparison purposes, the input signals Inm and Inp have different voltages (Vinm2 and Vinp2), with a common mode voltage of 0.54 volts ((Vinm2+Vinmp2)=0.54 volts). In both examples, however, the voltage differences and the delays generated in the first and second active phases are essentially the same. As illustrated in FIG. 2, the change in common mode shifts the timings of the leading edges of the output signals Outm and Outp, but does not change the slope of the upwardly ramping voltages Vm and Vp, and does not change the difference in timing (that is, the delay) between the output signals Outm and Outp, indicating that the dynamic circuit 30 of FIG. 1 can operate with a very good common mode rejection ratio (CMRR).

Moreover, in the illustrated configuration, the comparators 56 and 58 do not become saturated, and the leading edges of the output signals Outm and Outp may be near the beginning or near the end of an active phase. The gain of the dynamic circuit 30 may be greater than that of a conventional voltage-to-delay device, because essentially the whole range, from near the beginning to near the end, of each active phase may be utilized. In this context, "gain" is equivalent to delay. As a result, a voltage-to-delay block for an analog-to-digital converter system may be constructed of fewer voltage-to-delay devices than would otherwise be required, thereby saving power and providing greater linearity for the overall voltage-to-delay function.

Figure 3:
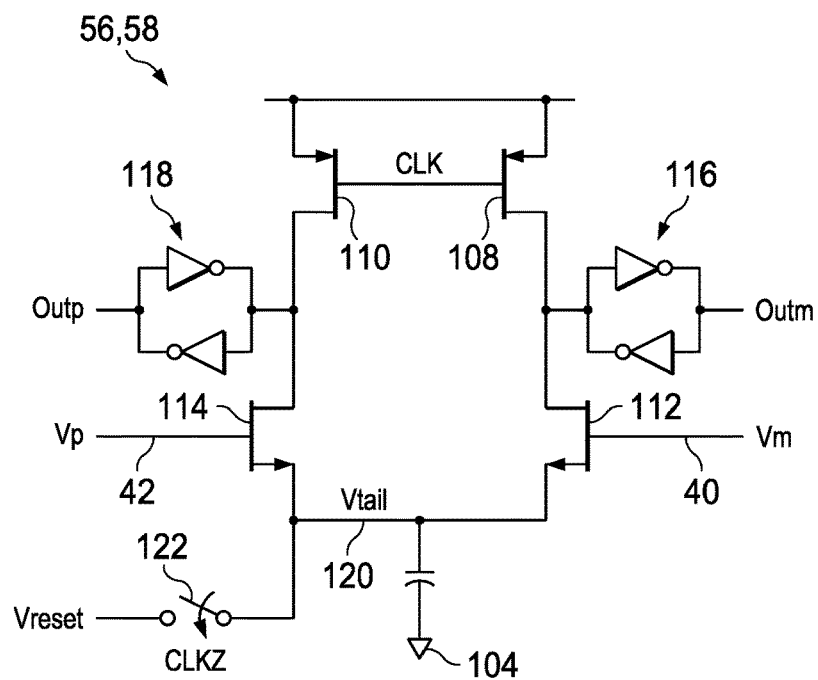
FIG. 3 is a circuit diagram of continuous time comparators of the dynamic circuit of FIG. 1.

FIG. 3 illustrates a suitable configuration for the continuous time comparators 56 and 58, where the clock signal CLK is applied to the gates of first and second transistors 108 and 110; the first and second voltages Vm and Vp are applied to respective third and fourth transistors 112 and 114; and the first and second output signals Outm and Outp are passed through the respective latch circuits 116 and 118. As discussed above in connection with FIGS. 1 and 2, the first and second voltages Vm and Vp increase dynamically under the influence of the current source 100 when the clock signal is low (0). The latch circuit 116 is connected to the drains of first transistor 108 and third transistor 112. Latch circuit 118 is connected to the drains of second transistor 110 and fourth transistor 114. In operation, the voltage Vtail of a tail node 120 is reset at the start of each active phase, via a switch 122 operated under the control of a complement of the clock signal CLKZ. In the illustrated configuration, the threshold voltage Vth of the comparator 58 is the voltage Vtail of the tail node 120 plus the gate-source voltage (Vgs) of the fourth transistor 114 required to switch the fourth transistor 114 on.

As discussed above in connection with FIG. 2, the output signals Outm and Outp generated by the comparators 56 and 58 toggle when the respective input voltages Vm and Vp reach the threshold voltage Vth. The illustrated comparators 56 and 58 advantageously can be operated with low noise, and with low memory (that is, with low hysteresis effects), and the value of the threshold voltage Vth may be programmable and adjusted with low power. In the illustrated configuration, any noise or error sampled during a reset phase contributes the same amount of delay to both of the first and second output signals Outm and Outp, since the voltage of the tail node 120 does not settle when the clock signal CLK is high (1). An advantage of the illustrated configuration is that the comparators 56 and 58 do not draw any static current but are triggered by the dynamically increasing voltages Vm and Vp.

Figure 4:
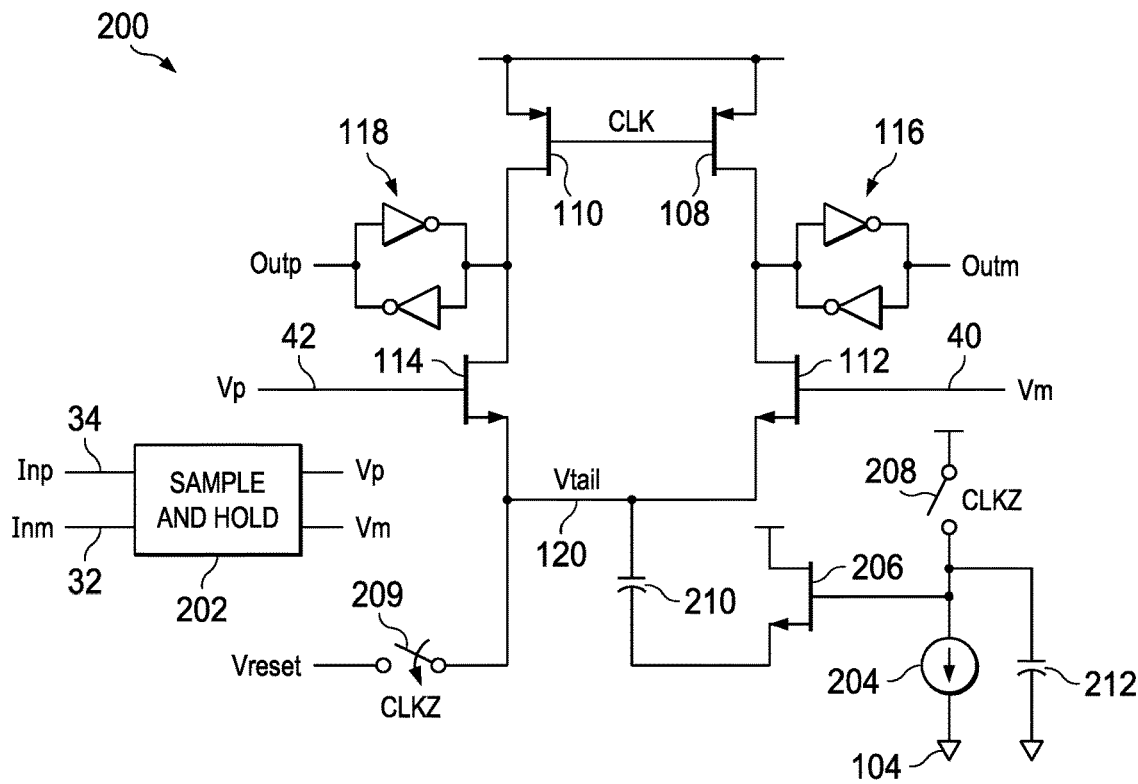
FIG. 4 is a circuit diagram of another dynamic circuit for sampling input signals and generating output signals with corresponding delay.

FIG. 4 illustrates a second dynamic circuit 200 for converting first and second input signals Inm and Inp, on lines 32, 34, into corresponding first and second digital output signals Outm and Outp. The second sampling circuit 200 includes a suitable sample and hold circuit 202 for sampling the first and second input signals Inm and Inp, and for applying corresponding first and second voltages Vm and Vp to the gates of respective third and fourth transistors 112 and 114. In contrast to the circuit 30 illustrated in FIG. 1, the second circuit 200 does not use a ramp current source to dynamically increase the first and second voltages Vm and Vp. Instead, the second sampling circuit 200 uses a ramp current source 204 to dynamically reduce the threshold voltage Vth. The ramp current source 204 of the second circuit 200 is connected to the gate of a fifth transistor 206, and is connected to a switch 208 which is controlled by the complement of the clock signal CLKZ. The fifth transistor 206 is coupled to the tail node 120 by a tail node capacitor 210. Operation of the second circuit 200 (FIG. 4) involves ramp generation of Vtail at the tail node 120 using the current source 204 and a capacitor 212, with buffering (206) and a capacitor coupling (210).

Figure 5:
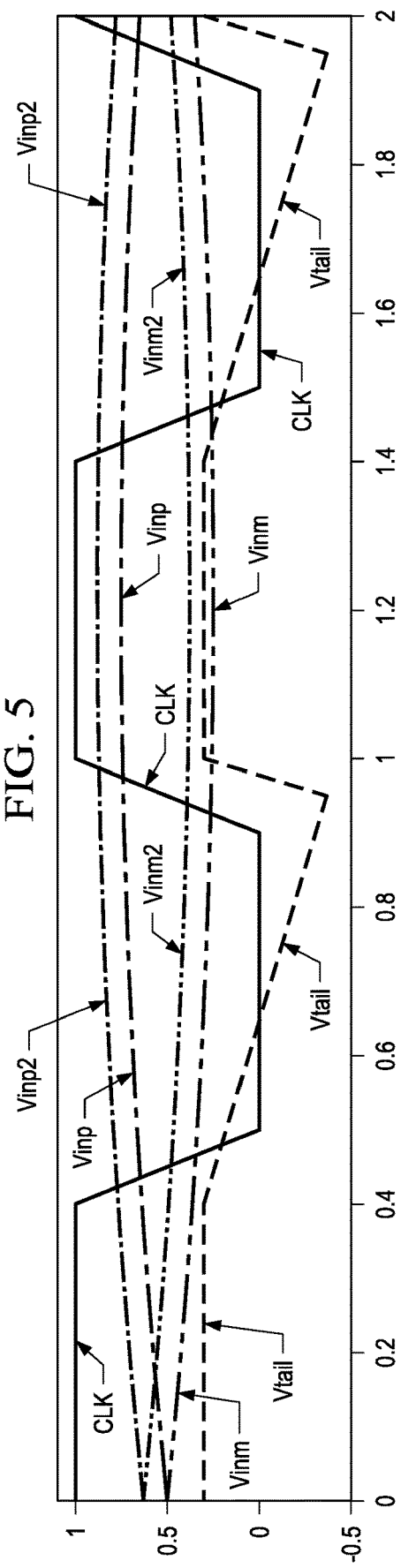
FIG. 5 is a diagram of timings and voltages of digital and analog signals processed by the dynamic circuit of FIG. 4.
Figure 5:
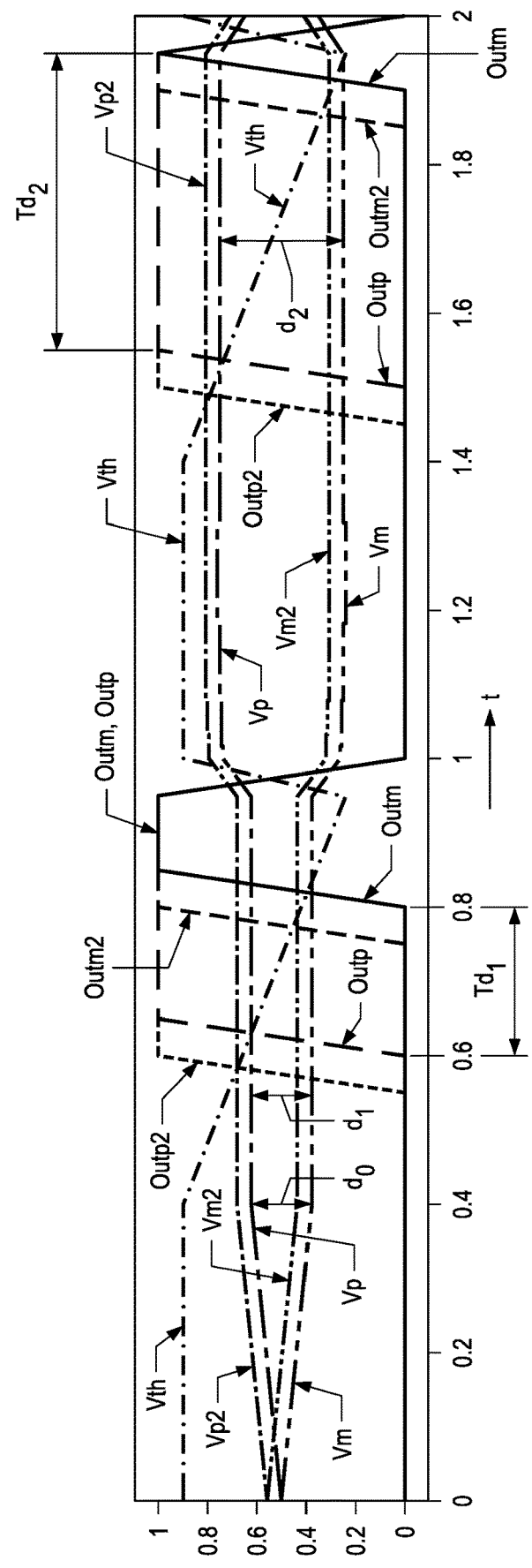

In the example illustrated in FIG. 5, a first reset phase is from time (t)=0.0 to t=0.4. During the first reset phase, the clock signal CLK is high, the complement of the clock signal CLKZ is low, and the sample and hold circuit 202 permits the first and second voltages Vm and Vp to remain approximately equal to the changing voltages Vinm and Vinp of the first and second input signals Inm and Inp. During the first reset phase, the high clock signal CLK is applied to the gates of the first and second transistors 108 and 110 (FIG. 4), and switches 208 and 209 are open. As a result, the threshold voltage Vth (FIG. 5) is maintained at a relatively high, constant value. In the example illustrated in FIGS. 4 and 5, the effective threshold voltage Vth is equal to the voltage Vtail on node 120 plus the required gate-source voltage Vgs of the fourth transistor 114. In the illustrated example, the required gate-source voltage Vgs of the fourth transistor 114 is 0.6V. As illustrated in FIG. 5, during the first reset phase, the tail-node voltage Vtail remains constant; therefore, the threshold voltage Vth also remains constant during the first reset phase.

During a first active phase, the clock signal CLK is low, the complement of the clock signal CLKZ is high, and the sample and hold circuit 202 causes the first and second voltages Vm and Vp to remain at constant values, equal to the values of the first and second voltages Vm and Vp at the end of the first reset phase (in the illustrated example, at t=0.4). During the first active phase, the difference d1 between the first and second voltages Vm and Vp remains approximately the same, and approximately the same as the difference d0 between the first and second voltages Vm and Vp at the time the clock signal CLK toggles low (that is, at the beginning of the first active phase). Further, during the first active phase, switches 208 and 209 are closed, such that the tail node voltage Vtail ramps downwardly, causing the threshold voltage Vth to likewise ramp dynamically downward. In the illustrated example, the threshold voltage Vth ramps linearly downward from about 0.9V at the beginning of the first active phase to about 0.3V at the end of the first active phase.

When the clock signal CLK becomes high again, at the end of the first active phase, the complement of the clock signal CLKZ becomes low again. During the subsequent second reset phase, the sample and hold circuit 202 permits the first and second voltages Vm and Vp to change and thereby return to and remain approximately equal to the changing voltages Vinm and Vinp of the first and second input signals Inm and Inp. During the second reset phase, the threshold voltage Vth returns to the value of the threshold voltage Vth during the first reset phase, and is maintained at that relatively high, constant value. In the example illustrated in FIG. 5, the clock signal CLK is high from the end of the first active phase until the end of the second reset phase, that is, from t=1.0 to t=1.4. The present disclosure is not limited, however, to the examples described herein.

When the clock signal CLK toggles low again, at the end of the second reset phase, switches 208 and 209 are closed, such that current from the current source 204 again causes the tail node voltage Vtail, and therefore also the threshold voltage Vth, to ramp downwardly. During the second active phase, the difference d2 between the first and second voltages Vm and Vp remains approximately the same, and approximately the same as the difference between the first and second voltages Vm and Vp at the time the clock signal CLK toggles low (that is, at the end of the second reset phase).

In the illustrated example, the difference d2 between the first and second voltages Vm and Vp at the end of the second reset phase and throughout the second active phase happens to be greater than the difference d1 between the first and second voltages Vm and Vp at the end of the first reset phase and throughout the first active phase. The difference between the difference values d1 and d2 reflects a corresponding difference between the voltages Vinm and Vinp of the first and second input signals Inm and Inp at the beginnings of the first and second active phases (at t=0.4 and t=1.4 in the illustrated example).

The first and second output signals Outm and Outp are digital signals. During the first active phase, the first output signal Outm toggles high (1) when the downwardly ramping threshold voltage Vth reaches the first voltage Vm. During the same first active phase, the second output signal Outp toggles high (1) when the downwardly ramping threshold voltage Vth reaches the second voltage Vp. In the illustrated example, the second voltage Vp is greater than the first voltage Vm (by an amount equal to d1) throughout the first active phase, such that the second output signal Outp precedes the first output signal Outm by a corresponding amount of delay Td1. Then, continuing with the illustrated example, at the end of the first active phase, the threshold voltage Vth and the first and second output signals Outm, Outp are reset. That is, the threshold voltage Vth returns to its reset (not reduced) value, and the output signals Outm, Outp both toggle low (0).

Continuing with the example illustrated in FIG. 5, during the second active phase (starting at t=1.4), the first output signal Outm toggles high (1) when the downwardly ramping threshold voltage Vth reaches the first voltage Vm, and the second output signal Outp toggles high (1) when the threshold voltage Vth reaches the second voltage Vp. In the illustrated example, during the second active phase, the second voltage Vp is greater than the first voltage Vm by an amount equal to d2, and the leading edge of the second output signal Outp precedes the leading edge of the first output signal Outm by a corresponding amount of delay Td2. The difference d2 between the first and second voltages Vm and Vp in the second active phase is greater than the difference d1 in the first active phase. Consequently, the delay Td2 represented by the output signals Outm and Outp in the second active phase is greater than the delay Td1 represented in the first active phase. At the end of the second active phase, the threshold voltage Vth is reset, and the first and second output signals Outm, Outp again toggle low (0).

The timing and voltages for the analog input voltages Vinm and Vinp, the dynamically influenced threshold voltage Vth, and the digital output signals Outm and Outp illustrated in FIG. 5 are for an example where the common mode of the analog input signal Inm and Inp is 0.5 volts. FIG. 5 also shows timings and voltages for a comparative example involving different analog input voltages Vinm2 and Vinp2, corresponding voltages Vm2 and Vp2, and digital output signals Outm2 and Outp2 (all shown in broken lines in FIG. 5), where the common mode voltage of the analog signal Inm and Inp in the second example is 0.54 volts. In both of the first and second examples, the voltage differences d1 and d2 and the delays generated in the first and second active phases are essentially the same. As illustrated in FIG. 5, the change in common mode shifts the timings of the leading edges of the output signals Outm and Outp, but does not change the slope of the downwardly ramping threshold voltage Vth, and does not change the difference in timing (that is, the delay) between the output signals Outm and Outp, indicating that the dynamic circuit 200 of FIG. 4 can operate with a very good common mode rejection ratio (CMRR).

Figure 6:
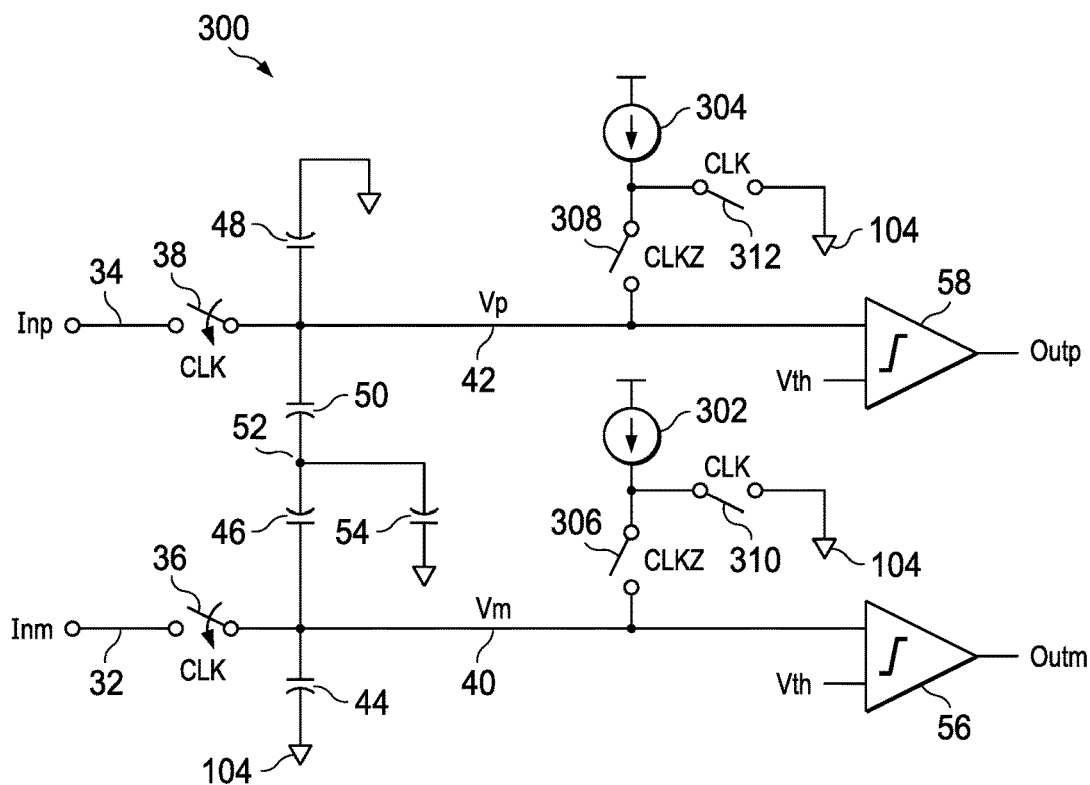
FIG. 6 is a circuit diagram of yet another dynamic circuit for sampling input signals and generating output signals with corresponding delay.

FIG. 6 illustrates a third dynamic circuit 300 for converting first and second input signals Inm and Inp into corresponding first and second digital output signals Outm and Outp. In contrast to the configuration illustrated in FIG. 1, the third sampling circuit 300 does not have a ramp current source connected directly to the middle node 52. Instead, the third circuit 300 has first and second ramp current sources 302 and 304 selectively connected directly to the respective first and second voltage lines 40 and 42, through respective ramp switches 306 308. The first and second current sources 302 and 304 are selectively connected to signal ground 104 through ground switches 310 and 312.

The ramp switches 306 and 308 are operated under the control of the complement of the clock signal CLKZ. The ground switches 310 and 312 are operated under the control of the clock signal CLK. As a result, the current sources 302 and 304 ramp up the respective input voltages Vm and Vp during the active phases, when the complement of the clock signal CLKZ is high (1), but are discharged, and do not influence the input voltages Vm Vp, during the reset phases, when the clock signal CLK is high (1). The currents supplied by the current sources 302, 304 may be individually and separately set and/or adjusted.

Analog-to-digital converters which convert signals containing time (or delay) information into digital codes may be constructed of digital components (gates, memories, etc.) which perform well with technology scaling. Such converters may have many advantages over conventional analog-to-digital converters. The present disclosure contributes to the development of time/delay-based analog-to-digital converters by, among other things, providing improved devices and systems for converting voltage domain information, carried by analog input signals, into delay domain information, carried by output signals.

If desired, some or all of the elements of the devices and systems described herein may be integrated into an integrated circuit (IC) and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates, and other suitable electronic devices that are not shown in the drawings for the sake of clarity.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

The invention claimed is:

1. A dynamic voltage-to-delay device, comprising:
   first and second voltage lines for receiving input signals during reset phases;
   a current source, connected to the first and second voltage lines, for increasing voltages on the voltage lines during active phases; and
   first and second comparators, connected to the first and second voltage lines, for generating first and second output signals during the active phases when the voltages on the voltage lines reach a threshold voltage, such that a delay between the first and second output signals is representative of a difference between voltages of the input signals.

2. The dynamic voltage-to-delay device of claim 1, further comprising first and second switches, connected to the first and second voltage lines, for applying the input signals to the first and second voltage lines during the reset phases, and for permitting the voltages on the voltage lines to be increased during the active phases.

3. The dynamic voltage-to-delay device of claim 2, further comprising a third switch, connected to the current source, for discharging the current source to signal ground during the reset phases, and for permitting the voltages on the voltage lines to be increased during the active phases.

4. The dynamic voltage-to-delay device of claim 3, further comprising first and second capacitors located between the current source and the voltage lines.

5. The dynamic voltage-to-delay device of claim 3, wherein the first and second comparators include a tail node, and wherein the dynamic voltage-to-delay device includes a fourth switch for applying voltage to the tail node during the active phases.

6. The dynamic voltage-to-delay device of claim 5, wherein the first and second comparators include first and second latch circuits for generating the output signals.

7. A dynamic voltage-to-delay device, comprising:
   a voltage line coupled to an input signal during a first phase;
   a current source connected to the voltage line and operable to increase a voltage on the voltage line during a second phase different than the first phase; and
   a comparator connected to the voltage line and operable to output an output signal during the second phase responsive to the voltage on the voltage line exceeding a threshold voltage, such that timing of the output signal is representative of voltage of the input signal.

8. The dynamic voltage-to-delay device of claim 7, further comprising a first switch, connected to the current source, for discharging the current source during the first phase.

9. The dynamic voltage-to-delay device of claim 8, further comprising a second switch, connected to the voltage line, for permitting the voltage on the voltage line to be increased during the second phase.

10. The dynamic voltage-to-delay device of claim 8, wherein the voltage line, the input signal, the current source, the comparator, and the output signal are a first voltage line, a first input signal, a first current source, a first comparator, and a first output signal, and wherein the dynamic voltage-to-delay device further comprises a second voltage line, connected to the first voltage line, for receiving an input signal during the first phase, a second current source, connected to the second voltage line, for increasing voltage on the second voltage line during the second phase, and a second comparator, connected to the second voltage line, for generating a second output signal during the second phase when the voltage on the second voltage line reaches the threshold voltage, such that delay between the first and second output signals is representative of a difference between voltages of the first and second input signals.

11. The dynamic voltage-to-delay device of claim 10, wherein the first and second comparators form a differential pair each with an output node which is first in a first phase, and wherein an input transistor pair turns on when respective first and second voltages are great enough for the input transistor pair to turn on, making the output signals toggle at corresponding times.

12. The dynamic voltage-to-delay device of claim 11, further including a tail node, and wherein the voltage-to-delay device includes a fourth switch for applying voltage to the tail node during the second phases, and a capacitor at the tail node to hold the voltage during the second phases.

13. The dynamic voltage-to-delay device of claim 11, wherein the comparators include first and second latch circuits for generating the output signals.

14. A dynamic voltage-to-delay device, comprising:
first and second conductors operable to be connected to input signals during reset phases;
first and second comparators, connected to the first and second conductors, and having a tail node, wherein the first and second comparators are configured to generate first and second output signals during active phases;
a transistor connected to the tail node and a current source for reducing a threshold voltage during the active phases; and
the first and second output signals change states responsive to the threshold voltage exceeding voltages on the first and second conductors, to thereby produce delay between the first and second output signals representative of a difference between voltages of the input signals.

15. The dynamic voltage-to-delay device of claim 14, further comprising a sample and hold circuit for applying the voltages of the input signals to the first and second conductors during the reset phases.

16. The dynamic voltage-to-delay device of claim 15, further comprising a switch, connected to the tail node, for applying voltage to the tail node during the active phases.

17. The dynamic voltage-to-delay device of claim 16, further comprising first and second latch circuits, connected to the tail node, for generating the first and second output signals.

18. The dynamic voltage-to-delay device of claim 17, further comprising first and second transistors having first and second gates, wherein the tail node is connected to the first and second transistors, and wherein the voltages on the first and second conductors are applied to the gates of the first and second transistors.

\* \* \* \* \*